180# United States Patent [19]

Cunningham, Jr. et al.

[11] 4,214,234

[45] Jul. 22, 1980

[54] RANGE TRACKING ANALOG TO DIGITAL CONVERTER FOR USE WITH A BRIDGE

[75] Inventors: Joseph E. Cunningham, Jr., Boulder; Anthony Grombone, Lafayette, both of Colo.

[73] Assignee: International Business Machines Corporation, Armonk, N.Y.

[21] Appl. No.: 9,329

[22] Filed: Feb. 5, 1979

[51] Int. Cl.² ............................................. H03K 13/20
[52] U.S. Cl. ........................ 340/347 AD; 73/362 AR; 340/347 CC
[58] Field of Search ................. 340/347 AD, 347 CC, 340/347 NT, 347 M; 324/99 D, 101, 130; 73/362 AR

[56] References Cited

U.S. PATENT DOCUMENTS

| | | | |
|---|---|---|---|
| 2,897,486 | 7/1959 | Alexander | 340/347 AD |
| 3,178,583 | 4/1965 | Koch | 307/88.5 |
| 3,333,262 | 7/1967 | Orsen | 340/347 |
| 3,411,153 | 11/1968 | Steele | 340/347 AD |
| 3,493,963 | 2/1970 | Schluter | 340/347 |
| 3,543,152 | 11/1970 | Niedereder | 324/99 D |
| 3,593,007 | 7/1971 | Seitz | 235/92 NT |
| 3,597,760 | 8/1971 | Fox | 340/347 AD |
| 3,875,501 | 4/1975 | Hayashi | 340/347 AD |
| 3,942,123 | 3/1976 | Georgi | 340/347 NT |
| 3,996,453 | 12/1976 | Coia | 340/347 AD |
| 4,031,533 | 6/1977 | Neumann | 340/347 NT |
| 4,034,294 | 7/1977 | Dalley | 325/38 R |

Primary Examiner—Charles D. Miller
Attorney, Agent, or Firm—Charles E. Rohrer

[57] ABSTRACT

A circuit providing digital representation of an analog error voltage present as an output of a bridge circuit where the digital representation is independent of supply voltage variations to the bridge circuit. The circuit shows a capacitor designed to ramp from an initial voltage representative of the zero point of the analog error voltage range to a full-scale error voltage in the amount of time it takes for a digital counter to count from zero to full scale. The ramping voltage is compared to the error voltage in order to decode error count whenever the ramping voltage reaches a value just in excess of the error voltage.

1 Claim, 5 Drawing Figures

RANGE TRACKING ANALOG TO DIGITAL CONVERTER FOR USE WITH A BRIDGE

The invention relates to analog to digital converters for use with a bridge and more particularly to a circuit which produces a range of digital outputs unaffected by supply voltage variation.

BACKGROUND OF THE INVENTION

Bridge circuits are frequently used in feedback control systems in order to supply an analog output proportional to the sensed condition where a steady state operation is the object of the sensing system. Other elements of the bridge are designed so that any variation away from the desired control point in the sensed condition produces an error signal at the output of the bridge. The error signal may then be converted into a digital quantity in order to take corrective action.

One of the significant problems relating to the use of bridge circuits is that the output of the bridge circuit is not only affected by changes in the sensed condition, but may also be affected by variations in the supply voltage to the bridge. In order to remedy that problem, voltage regulators have been used with bridge power supplies. While that technique does remedy the problem, it can be quite expensive if the power supply is also connected to other apparatus, that is, where the power supply has a significant load. Additionally, if regulation is to be 1 percent or less of nominal voltage value, the regulator can be quite expensive even where relatively small loads are present.

The innovative circuit of this invention supplies an answer to the above problem and therefore has for its main object the production of a digital representation of an error voltage from a bridge circuit which is insensitive to the effects of power supply variation.

SUMMARY OF THE INVENTION

This invention is a circuit which combines an error-sensing bridge circuit with an analog to digital converter comprised of a charging capacitor, a comparator and a counter. The effect of variation in the error voltage due to variation in power supply voltage is matched with the effect of variation in the capacitor voltage due to variation in power supply voltage. Through the matching of these voltages and the unique configuration of the circuit, a range of digital output is caused to track the analog range of error in the sensed condition in a manner independent of supply voltage variation.

BRIEF DESCRIPTION OF THE DRAWINGS

The above-mentioned and other features and objects of this invention and the manner of attaining them will become more apparent and the invention itself will best be understood by reference to the following description of embodiments of the invention taken in conjunction with the accompanying drawings, the description of which follows.

FIG. 1A shows the current to voltage converter.

FIG. 1B shows the feedback amplifier.

DETAILED DESCRIPTION

The detailed description of the invention is provided in the context of a circuit for use with the fuser of an electrophotographic copying machine in which one of the resistance values in the bridge is a thermistor which is used to gain the measure of the temperature of the fuser through a variation of the thermistor resistance with that temperature. The bridge output is supplied to an analog to digital converter which provides a digitized output representative of the temperature deviation from the desired control point. That output may then be used to regulate the amount of power applied to the fuser heater for the requisite time period in order to bring the fuser temperature back to the desired control point. Obviously, should the supply voltage input to the bridge change, the result would be a digital output which would provide an incorrect amount of power to the fuser unless that variation in supply voltage was compensated. This invention ensures that as supply voltage changes, input to the power control over the fuser does not become inaccurate. This invention may be applied in circuits sensing conditions other than temperature, such as speed or fluid level, for example, and the implementing circuits may then change appropriately. However, the essence of the invention which will now be described, will be the same regardless of application.

Figure 1:
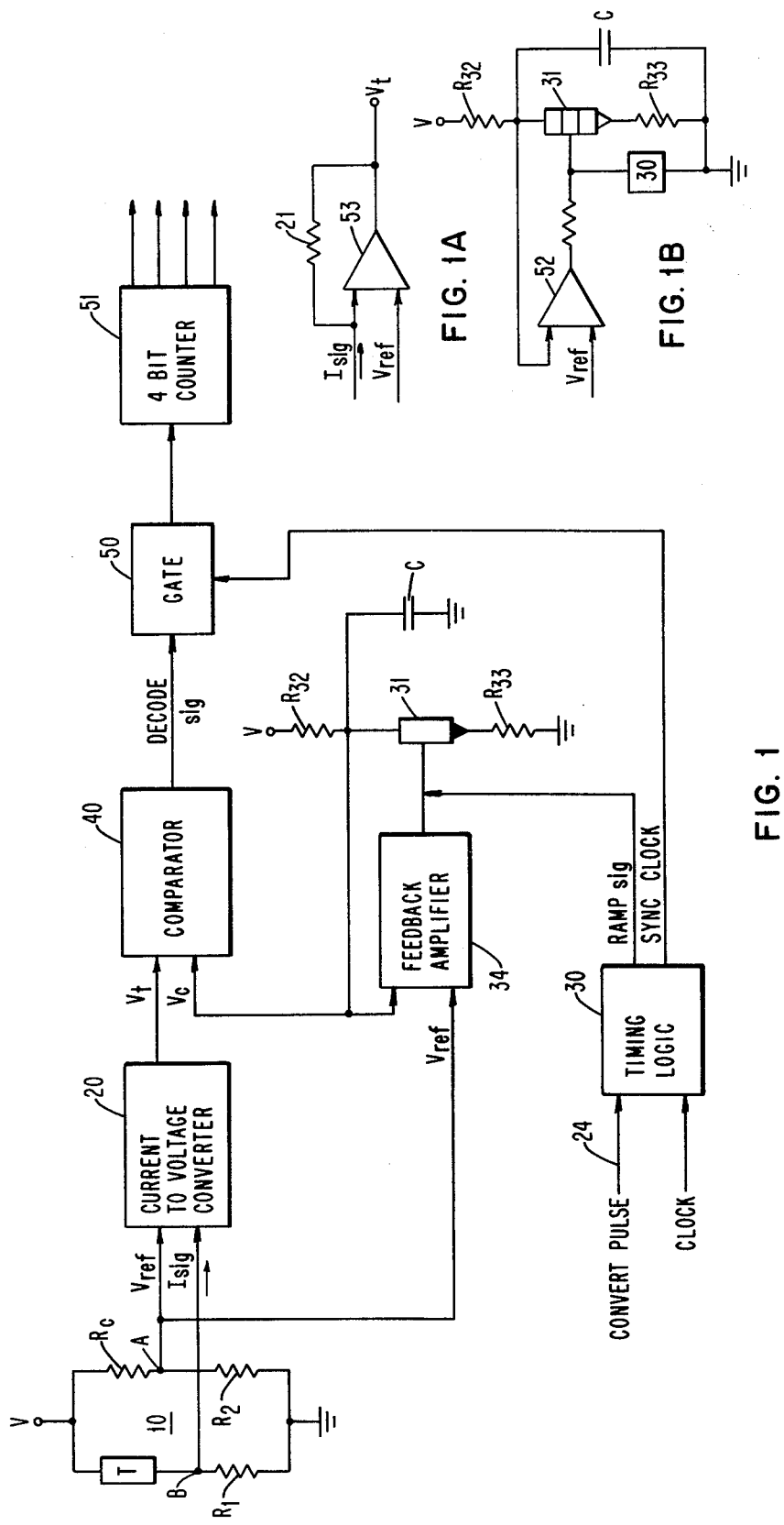
FIG. 1 is a circuit diagram primarily in block form of the circuit of this invention.

In FIG. 1 a bridge circuit 10 receives a supply voltage V which is, for illustration, a nominal +8.5 volts with a tolerance range of ±10 percent. A thermistor T, together with a resistor $R_1$, is located in one leg of the bridge while the other leg of the bridge includes a resistor $R_C$ and a resistor $R_2$. While other resistance values could be chosen, it is always simple to match component bridge resistances such that $R_1 = R_2$ and at the desired control temperature a resistance associated with a thermistor $R_T = R_C$.

The output of bridge circuit 10 is supplied to a current to voltage converter 20, shown in detail in FIG. 1A, which is comprised essentially of an operational amplifier (OP AMP) 53 which forces the signal voltage at point B to equal the reference voltage at point A. The output of OP AMP 53 is an error voltage $V_t$, which is proportional to the resistances in the bridge circuit together with an OP AMP feedback resistor 21, as shown in FIG. 1A. The equation for the circuit is:

$$V_t = V\left[\frac{R_2 + R_{21}\left(\frac{R_2}{R_1} - \frac{R_C}{R_T}\right)}{R_C + R_2}\right]$$

In the circuit shown in FIG. 1 with $R_1 = R_2$, the current level $I_{SIG}$ is zero when the sensed condition, i.e., the temperature in this case, creates a resistance in the thermistor which is equal to $R_C$. As FIG. 1 shows, the voltage at point A is in essence a reference voltage, while the current level $I_{SIG}$ from point B is in essence an error signal converted to an error voltage by converter 20. Consequently, when the circuit is set up so that $R_T = R_C$ at the desired control temperature, $I_{SIG}$ and the error voltage are zero at that temperature.

Figure 3:
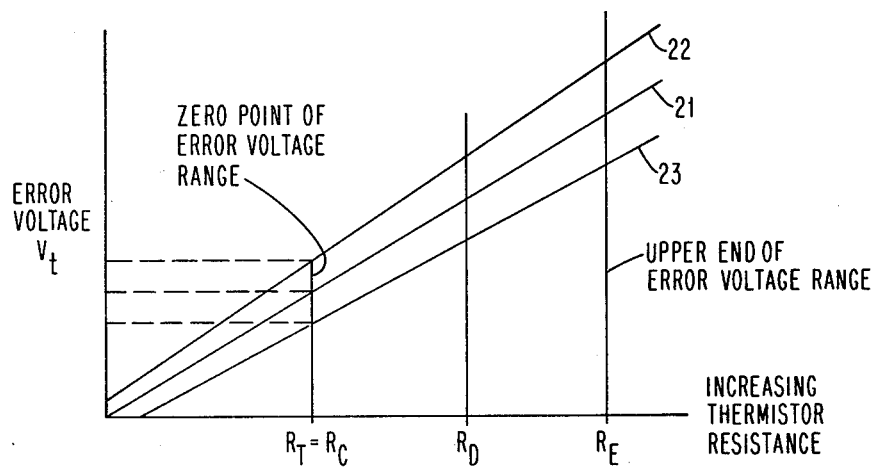
FIG. 3 is a graphical representation of the error voltage produced by changes in the sensed condition.

Referring now to FIG. 3, there is shown a graphical representation of the rise in error voltage $V_t$ as the thermistor resistance increases. For example, at a nominal power supply voltage of +8.5 volts, the error voltage produced for various thermistor resistance values is shown by curve 21. Curve 22 represents the curve for the case where the power supply has increased by 10 percent and curve 23 indicates the curve for the case where power supply voltage has been decreased by 10 percent. Bridge balance is the condition where the thermistor resistance is equal to $R_C$ and, as previously stated, when $R_2=R_1$. Thus, FIG. 3 shows that the magnitude of error voltage changes significantly with change in power supply voltage not only for error conditions, but also at bridge balance where the error voltage level should signify zero temperature error.

Referring now to FIGS. 1 and 1B, it is seen that the charge on capacitor C at the beginning of a test sequence (t=0), is forced to equal $V_{REF}$ (the voltage at point A) by the feedback amplifier circuit 34 and transistor circuit 31. Thus, the initial value of the capacitor voltage is set at a lower end of an error voltage range corresponding to the upper end of a temperature range to be tracked by the circuit of this invention. Note that the upper end of the temperature range to be tracked is the desired control point and therefore the low end of the error voltage range represents the control point. This value will henceforth be called the zero point of the error voltage range. Referring to FIG. 3, this zero point is shown for the $R_T=R_C$ condition, and the change in error voltage with power supply variation at the zero point is clearly shown. FIG. 3 also shows the upper end of the range to be tracked at $R_E$.

Returning to a discussion of the circuit at t=0, an initiating pulse 24 is fed to a timing circuit 30, producing a signal which turns off transistor 31. By so doing, the capacitor C begins to charge through resistor $R_{32}$, causing its voltage to ramp toward the power supply level (V). The equation for the capacitor circuit during the charging period is:

$$V_C = V[1 - (\frac{R_C}{R_C + R_2})e^{-t/R_{32}C}]$$

Figure 2:
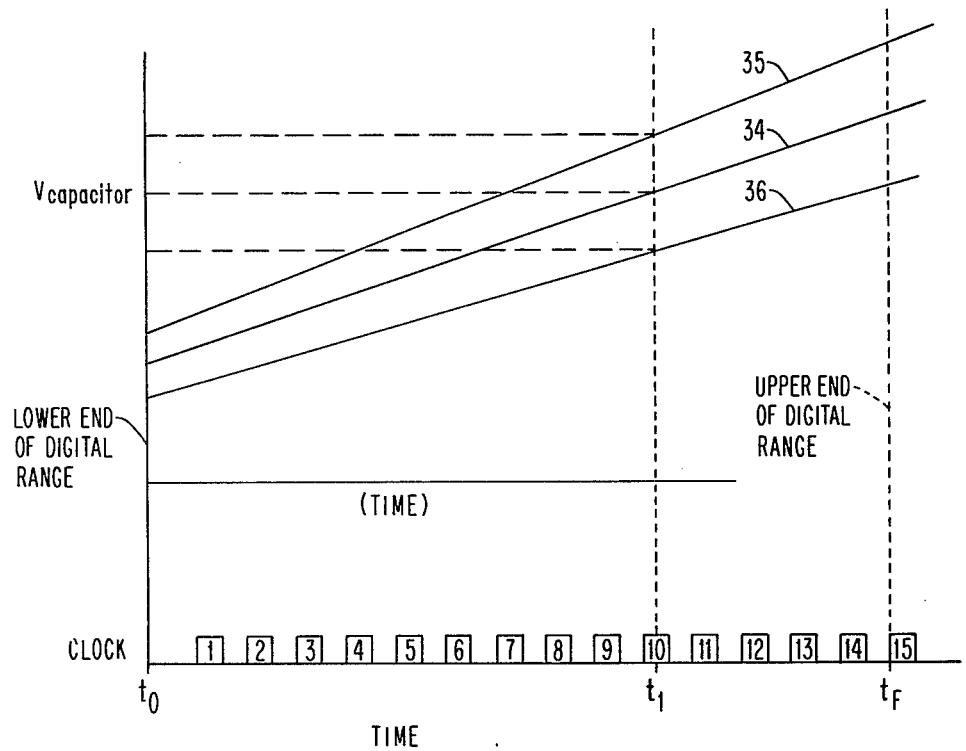
FIG. 2 is a graphical representation of the voltage levels on the charging capacitor with time.

Referring now to FIG. 2, there is illustrated the ramping voltage present on the capacitor during a time period $t_0t_1$. It should be noted that in the particular example shown in FIG. 2, approximately 7.5 clock pulses are provided during the time period. This arbitrarily selected time period represents the length of time for the capacitor to charge from its initial value to a value equal to a particular error voltage. Ramping curve 34 represents the charging of the capacitor when a supply voltage is at a nominal value, e.g., +8.5 volts. Ramp 35 represents the charging of the capacitor when the supply voltage is at a +10 percent tolerance and ramp 36 represents the charging of the capacitor when the supply voltage is at a −10 percent tolerance.

In FIG. 3 curves 21, 22 and 23 show that when the temperature level is sensed as too low the error voltage increases to a level indicative of the amount by which the temperature is too low. Thus, for a particular thermistor resistance value equal to $R_D$, for example, a particular error voltage will be present as an input to the comparator 40 in FIG. 1. Time is not a factor in the diagram shown in FIG. 3 but rather the sensed temperature is the factor denoting at what point on the sloping curve 21, 22 and 23 the error voltage will be indicated. An important feature of FIG. 3 is that it shows that for different supply voltages the same thermistor resistance produces different error voltages. In FIG. 2 it is seen that the charge level on the capacitor builds to a different value during a particular time period $t_0t_1$ depending upon the supply voltage. Consequently, three different curves, 34 35 and 36, are shown, each reaching a different level by the end of time period $t_0-t_1$. The inventors herein have recognized that these different levels can be used to offset changes in error voltage since in both instances the reason is the same, i.e., the change in supply voltage. Consequently, the ramping capacitor can be used to create a condition where the output of the analog to digital converter is independent of the supply voltage variation.

Referring again to FIG. 1, the manner in which this is accomplished is shown through the inputs to the comparator 40. Note that the error voltage is placed on one input while the capacitor voltage is placed on the other. As long as the error voltage is at a value in excess of the capacitor voltage, gate 50 is closed, allowing counter 51 to count clock pulses. When the ramping capacitor voltage reaches a level just in excess of the error voltage, the decode signal is enabled, opening gate 50 to end the counting cycle. Thus, the count is dependent upon the length of time it takes the ramping voltage to reach the magnitude of the error signal. Since both the ramping voltage and the error voltage change proportionately to variations in power supply voltage, the count is made independent of supply voltage variations. If the fuser is cold, $R_T$ may be greater than $R_E$ (FIG. 3), and therefore higher than the upper end of the error voltage range. In this case the capacitor voltage does not reach the error voltage level during the period $t_0t_f$(FIG. 2). In this situation the circuit is reset to its initial value and full power is supplied to the fuser.

The sequence is as follows. At t=0, a pulse 24 is received by the timing circuit 30, causing clock pulses to be provided through gate 50 to counter 51. Simultaneously, the convert pulse 24 turns off transistor 31, enabling the voltage on the capacitor to ramp upwardly from its initial value toward the power supply voltage (V), e.g., +8.5±10 percent. As the capacitor voltage ramps upwardly, at some point it will exceed the error signal (assuming the fuser temperature is in the tracking range). At that point the decode signal is enabled, the gate 50 is opened and the counter supplies a count of the clock pulses counted during the time period to a processor, not shown, which translates the count into the amount of power which must be supplied to the heater of the fuser in order to bring the temperature back to a desired level.

If the temperature is outside the tracking range by being at the desired level or above, the voltage on the capacitor will exceed the error voltage immediately and thus the count from counter 51 is zero and the fuser heater will not be energized. If the temperature is outside the tracking range by being too cold, full power will be supplied.

To perform in the manner described, the capacitor-charging circuit has to satisfy two requirements. First, the capacitor-charging circuit must always start from the zero point of the analog voltage range. That is to say, it must start at that particular error voltage which indicates zero temperature error. Consequently, no matter what the supply voltage, the capacitor ramps from a voltage value which signifies zero temperature error. The second requirement of the capacitor-charging circuit is that the time constant $R_{32}C$ must be chosen such that the capacitor charges to nominal full scale error voltage in the amount of time that the clock takes to make the counter count the full digital scale which, in the example shown (4-bit counter), is 15. Full-scale error voltage corresponds to that fuser temperature at which 100 percent power is needed.

By meeting the above circuit requirements, the charging equation for the capacitor and the equation for error voltage, both of which are dependent upon variation in supply voltage, result in a cancellation of the effect of the variation in supply voltage by creating a definite time at which the count is decoded for a certain temperature error. Thus, as the supply voltage varies, the digital output always tracks the analog range of temperatures.

It should be noted that while the curves shown in FIGS. 2 and 3 are linear for ease of illustration, the capacitor voltage is actually exponential as previously set forth and thermistor values also change at a non-linear rate. For other applications the capacitor voltage can be made truly linear by the use of a current source dependent upon V used in place of $R_{32}$.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A range-tracking circuit whose output is independent of variations in supply voltage comprising:
    means including a bridge circuit for producing an error voltage proportional to changes in a sensed condition;
    a capacitor;
    a power supply connected to the bridge circuit and to the capacitor;
    clock means for producing clock pulses;
    counter means for counting clock pulses;
    timing means connected to said clock means and said counter means for initiating the start of a counting time period;
    means connected to said bridge circuit, said capacitor and said timing means for establishing a capacitor voltage corresponding to the zero point of the error voltage range prior to initiating the start of a counting time period;
    means for charging the capacitor to full-scale error voltage during a full digital scale counting time period; and
    comparator means connected to compare error voltage and capacitor voltage and connected to said counter means to interrupt the count prior to full digital scale when the error is less than full scale, whereby the count produced by the counter means represents error in the sensed condition independent of supply voltage variation.

* * * * *